(12) United States Patent
Balar et al.

(10) Patent No.: US 11,489,537 B2
(45) Date of Patent: Nov. 1, 2022

(54) SYSTEMS WITH ADC CIRCUITRY AND ASSOCIATED METHODS

(71) Applicant: SEMICONDUCTOR COMPONENTS INDUSTRIES, LLC, Phoenix, AZ (US)

(72) Inventors: Bharat Balar, Bengaluru (IN); Parthasarthy V. Sampath, Bangalore (IN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 144 days.

(21) Appl. No.: 16/948,283

(22) Filed: Sep. 11, 2020

(65) Prior Publication Data
US 2021/0328594 A1     Oct. 21, 2021

(30) Foreign Application Priority Data
Apr. 16, 2020 (IN) .............................. 202011016465

(51) Int. Cl.
*H03M 1/10* (2006.01)
*G01S 13/04* (2006.01)
*G01S 7/40* (2006.01)

(52) U.S. Cl.
CPC ............ *H03M 1/1071* (2013.01); *G01S 7/40* (2013.01); *G01S 7/4021* (2013.01); *G01S 13/04* (2013.01); *H03M 1/109* (2013.01)

(58) Field of Classification Search
CPC ...... H03M 1/1071; H03M 1/109; H03M 1/12; H03M 1/164; G01S 7/40; G01S 7/4021; G01S 13/04

(Continued)

(56) References Cited

U.S. PATENT DOCUMENTS

| | | | |
|---|---|---|---|
| 7,031,683 B2* | 4/2006 | Vishakhadatta | H04B 1/0003 455/259 |
| 7,177,610 B2* | 2/2007 | Scott | H04B 1/0003 455/259 |

(Continued)

OTHER PUBLICATIONS

Wibbenmeyer et al., "Built-In Self-Test for Low-Voltage High-Speed Analog-to-Digital Converters," in IEEE Transactions on Instrumentation and Measurement, vol. 56, No. 6, pp. 2748-2756, Dec. 2007.

(Continued)

*Primary Examiner* — Jean B Jeanglaude
(74) *Attorney, Agent, or Firm* — Treyz Law Group, P.C.; Tianyi He

(57) ABSTRACT

A system may include ADC circuitry. To test the performance of the ADC circuitry, the system may include ADC testing circuitry coupled to the ADC circuitry. In particular, the ADC testing circuitry may include reference voltage generation circuitry configured to generate reference voltages serving as test voltages for the ADC circuitry. The ADC circuitry may be coupled to a test input for receiving the test voltages via switching circuitry and may be coupled to a main data input for receiving system data via the switching circuitry. Testing may occur during an idling time period of the system and when the switching circuitry couples the test input to the ADC circuitry. Test input voltages corresponding to one or more stages in the ADC circuitry may be provided to the ADC circuitry, and corresponding output values from the ADC circuitry may be compared to an expected value and/or expected threshold values.

20 Claims, 10 Drawing Sheets

(58) Field of Classification Search
USPC .......................................................... 341/120
See application file for complete search history.

(56) References Cited

U.S. PATENT DOCUMENTS

| | | | | |
|---|---|---|---|---|
| 7,228,109 B2* | 6/2007 | Paulus | .................... | H04B 15/02 |
| | | | | 455/88 |
| 8,558,726 B2* | 10/2013 | Cheong | ................. | H03M 1/108 |
| | | | | 341/120 |
| 9,438,262 B1* | 9/2016 | Chen | ..................... | H03M 1/109 |
| 10,236,902 B1* | 3/2019 | More | ..................... | H03M 1/462 |
| 10,763,886 B1* | 9/2020 | Narayan | ............. | H03M 3/3287 |
| 2003/0063690 A1* | 4/2003 | Paulus | .................... | H04B 1/406 |
| | | | | 375/319 |
| 2013/0169456 A1* | 7/2013 | Cheong | ................. | H03M 1/108 |
| | | | | 341/120 |
| 2016/0211861 A1* | 7/2016 | Op 't Eynde | ....... | H03M 1/1038 |
| 2019/0222222 A1* | 7/2019 | More | .................... | H03M 1/468 |

OTHER PUBLICATIONS

Xing et al., "A fully digital-compatible BIST strategy for ADC linearity testing," 2007 IEEE International Test Conference, Santa Clara, CA, 2007.

Karanicolas et al., "A 15-b 1-Msample/s Digitally Self-Calibrated Pipeline ADC," IEEE Journal of Solid-State Circuits, vol. 28, No. 12, pp. 1207-1215, Dec. 1993.

* cited by examiner

| Stage | 1 | 2 | 3 | 4 | 5 | 6 | 7 | 8 | 9 |
|---|---|---|---|---|---|---|---|---|---|
| Bits Per stage | 2.5 | 1.5 | 1.5 | 1.5 | 1.5 | 1.5 | 1.5 | 1.5 | 1.5 |
| Required Loop Gain | 75 | 70 | 65 | 60 | 55 | 55 | 55 | 55 | 55 |

| Stage | 1 | 2 | 3 | 4 | 5 | 6 | 7 | 8 | 9 |
|---|---|---|---|---|---|---|---|---|---|
| BW required | 2.95E+08 | 2.60E+08 | 2.40E+08 | 2.20E+08 | 2.00E+08 | 2.00E+08 | 1.50E+08 | 1.50E+08 | 1.50E+08 |

| SNDR | SFDR | ENOB |
|---|---|---|
| 78.213088 | 100.255571 | 12.699848 |

| Stage | 1 | 2 | 3 | 4 | 5 | 6 | 7 | 8 | 9 |
|---|---|---|---|---|---|---|---|---|---|
| Bits Per stage | 2.5 | 1.5 | 1.5 | 1.5 | 1.5 | 1.5 | 1.5 | 1.5 | 1.5 |
| Loop Gain | 75 | 70 | 65 | 60 | 55 | 55 | 55 | 55 | 55 |

| Stage | 1 | 2 | 3 | 4 | 5 | 6 | 7 | 8 | 9 |
|---|---|---|---|---|---|---|---|---|---|
| BW required(Hz) | 1.00E+08 | 2.60E+08 | 2.40E+08 | 2.20E+08 | 2.00E+08 | 2.00E+08 | 1.50E+08 | 1.50E+08 | 1.50E+08 |

| Comparator Thresholds | 1.25 | 0.75 | 0.25 | -0.25 | -0.75 | -1.25 |
|---|---|---|---|---|---|---|

| Case | vin0 | vin1 | vin2 | asil_code | asil_code | asil_code | SNDR | SFDR | ENOB |
|---|---|---|---|---|---|---|---|---|---|
| Expected | -0.25 | 0 | 0.25 | 3583 | 4095 | 4607 | 78.2131 | 100.256 | 12.6998 |
| With settling error | -0.25 | 0 | 0.25 | 3572 | 4095 | 4596 | 52.336 | 58.6846 | 8.40133 |

| | Deviation | -11 | 0 | -11 |
|---|---|---|---|---|

| Stage | 1 | 2 | 3 | 4 | 5 | 6 | 7 | 8 | 9 |
|---|---|---|---|---|---|---|---|---|---|
| Bits Per stage | 2.5 | 1.5 | 1.5 | 1.5 | 1.5 | 1.5 | 1.5 | 1.5 | 1.5 |
| Loop Gain | 75 | 30 | 65 | 60 | 55 | 55 | 55 | 55 | 55 |

| Stage | 1 | 2 | 3 | 4 | 5 | 6 | 7 | 8 | 9 |
|---|---|---|---|---|---|---|---|---|---|
| BW required(Hz) | 2.95E+08 | 2.60E+08 | 2.40E+08 | 2.20E+08 | 2.00E+08 | 2.00E+08 | 1.50E+08 | 1.50E+08 | 1.50E+08 |

| Comparator Thresholds | 0.5 | -0.5 |
|---|---|---|

| Case | vin0 | vin1 | vin2 | asil_code0 | asil_code1 | asil_code3 | SNDR | SFDR | ENOB |
|---|---|---|---|---|---|---|---|---|---|
| Expected | -0.125 | 0 | 0.125 | 3839 | 4095 | 4351 | 78.213088 | 100.255571 | 12.699848 |
| With Gain error | -0.125 | 0 | 0.125 | 3847 | 4095 | 4343 | 53.549598 | 63.732103 | 8.602923 |
| | | | Deviation | 8 | 0 | -8 | | | |

| Stage | 1 | 2 | 3 | 4 | 5 | 6 | 7 | 8 | 9 |
|---|---|---|---|---|---|---|---|---|---|
| Bits Per stage | 2.5 | 1.5 | 1.5 | 1.5 | 1.5 | 1.5 | 1.5 | 1.5 | 1.5 |
| Loop Gain | 75 | 70 | 65 | 60 | 55 | 55 | 55 | 55 | 55 |

| Stage | 1 | 2 | 3 | 4 | 5 | 6 | 7 | 8 | 9 |
|---|---|---|---|---|---|---|---|---|---|
| BW required(Hz) | 2.95E+08 | 1.00E+08 | 2.40E+08 | 2.20E+08 | 2.00E+08 | 2.00E+08 | 1.50E+08 | 1.50E+08 | 1.50E+08 |

| | | | Comparator Thresholds | | | 0.5 | -0.5 | |
|---|---|---|---|---|---|---|---|---|
| Case | vin0 | vin1 | vin2 | asil_code0 | asil_code1 | asil_code3 | SNDR | SFDR | ENOB |
| Expected | -0.125 | 0 | 0.125 | 3839 | 4095 | 4351 | 78.213088 | 100.255571 | 12.699848 |
| With settling error | -0.125 | 0 | 0.125 | 3845 | 4095 | 4345 | 56.886994 | 67.006047 | 9.157308 |
| | | | Deviation | 6 | 0 | -6 | | | |

| Stage | 1 | 2 | 3 | 4 | 5 | 6 | 7 | 8 | 9 |
|---|---|---|---|---|---|---|---|---|---|
| Bits Per stage | 2.5 | 1.5 | 1.5 | 1.5 | 1.5 | 1.5 | 1.5 | 1.5 | 1.5 |
| Loop Gain | 75 | 70 | 30 | 60 | 55 | 55 | 55 | 55 | 55 |

| Stage | 1 | 2 | 3 | 4 | 5 | 6 | 7 | 8 | 9 |
|---|---|---|---|---|---|---|---|---|---|
| BW required(Hz) | 2.95E+08 | 2.60E+08 | 2.40E+08 | 2.20E+08 | 2.00E+08 | 2.00E+08 | 1.50E+08 | 1.50E+08 | 1.50E+08 |

| Comparator Thresholds | 0.5 | -0.5 |
|---|---|---|

| Case | vin0 | vin1 | vin2 | asil_code0 | asil_code1 | asil_code3 | SNDR | SFDR | ENOB |
|---|---|---|---|---|---|---|---|---|---|
| Expected | -0.0625 | 0 | 0.0625 | 3967 | 4095 | 4223 | 78.213088 | 100.255571 | 12.699848 |
| With Gain error | -0.0625 | 0 | 0.0625 | 3971 | 4095 | 4219 | 60.666633 | 70.825758 | 9.785155 |
| Deviation | | | | 4 | 0 | -4 | | | |

| Stage | 1 | 2 | 3 | 4 | 5 | 6 | 7 | 8 | 9 |
|---|---|---|---|---|---|---|---|---|---|
| Bits Per stage | 2.5 | 1.5 | 1.5 | 1.5 | 1.5 | 1.5 | 1.5 | 1.5 | 1.5 |
| Loop Gain | 75 | 70 | 65 | 60 | 55 | 55 | 55 | 55 | 55 |

| Stage | 1 | 2 | 3 | 4 | 5 | 6 | 7 | 8 | 9 |
|---|---|---|---|---|---|---|---|---|---|
| BW required(Hz) | 2.95E+08 | 2.60E+08 | 80E+07 | 2.20E+08 | 2.00E+08 | 2.00E+08 | 1.50E+08 | 1.50E+08 | 1.50E+08 |

| Comparator Thresholds | 0.5 | -0.5 |
|---|---|---|

| Case | vin0 | vin1 | vin2 | asil_code0 | asil_code1 | asil_code3 | SNDR | SFDR | ENOB |
|---|---|---|---|---|---|---|---|---|---|
| Expected | -0.0625 | 0 | 0.0625 | 3967 | 4095 | 4223 | 78.213088 | 100.255571 | 12.699848 |
| With settling error | -0.0625 | 0 | 0.0625 | 3973 | 4095 | 4217 | 57.325918 | 67.479084 | 9.230219 |
| | | | Deviation | 6 | 0 | -6 | | | |

SYSTEMS WITH ADC CIRCUITRY AND ASSOCIATED METHODS

This application claims the benefit of and claims priority to Indian Provisional Patent Application No. 202011016465, filed Apr. 16, 2020, which is hereby incorporated by reference herein in its entirety.

BACKGROUND

This relates generally to implementations for assessing analog-to-digital converter (ADC) circuitry performance, and more specifically, to radio detection and ranging (RADAR) systems having ADC circuitry implementations compatible with one or more ASIL (Automotive Safety Integrity Level) requirements, and to the associated methods.

Modern object detection systems such as automotive systems can use RADAR systems to detect range, angle, and velocity of objects. These systems can include corresponding circuits operating in an analog domain or a digital domain. To bridge communications between the two domains, these systems can include analog-to-digital converter circuitry. In particular, a RADAR system can include receiver circuitry that uses ADC circuitry such as a pipeline ADC for medium/high speed and resolution applications in converting analog signals to digital data.

In automotive applications, on the fly circuit performance checks are becoming mandatory to meet ASIL requirements for the ISO (International Organization for Standardization) 26262 standard. To incorporate these checks for pipeline ADC circuitry performance, checks or testing for ADC parameters such as differential nonlinearity (DNL) and integral nonlinearity (INL), and/or fast Fourier transform (FFT) tests can be implemented. All of these implementations can add a substantial amount of hardware overhead to the circuit design (e.g., to the application-specific integrated circuit or ASIC design), thereby increasing the area and cost of the circuit design. These implementations can also introduce substantial overhead time, given that these implementations also require many inputs to be sampled.

It would therefore be desirable to provide systems having improved performance checking or testing circuitry for pipeline ADC circuitry (e.g., to satisfy one or more ASIL requirements).

DETAILED DESCRIPTION

Embodiments of the present invention relate to systems with amplifier circuitry and/or ADC circuitry, and more particularly testing circuitry for a pipeline ADC. If desired, the systems and methods in the present embodiments may be implemented in any suitable system such as a RADAR system. It will be recognized by one skilled in the art, that the present exemplary embodiments may be practiced without some or all of these specific details. In other instances, well-known operations have not been described in detail in order not to unnecessarily obscure the present embodiments.

The ADC circuitry (e.g., pipeline ADC circuitry) and ADC testing circuitry described herein may be generally implemented to check ADC performance with few input combinations that are selectively enabled. These specific few input combinations may be selected to detect performance degradation in MDAC stage performance. In particular, the ADC testing circuitry may be configured to detect errors caused by small signal parameter changes that cause gain errors, caused by capacitive value changes, etc.

As examples, MDAC stages, ADC circuitry, ADC testing circuitry, and the associated systems and methods described herein may be implemented, separately or in combination, as part of any electronic device such as a portable electronic device, a camera, a tablet computer, a desktop computers, a webcam, a cellular telephone, a video camera, a video surveillance system, an automotive imaging system, a video gaming system, a RADAR system, or any other electronic device that may include or exclude imaging capabilities. Arrangements in which the MDAC stages, ADC circuitry, ADC testing circuitry, and associated systems and methods are implemented as part of a RADAR system or an electronic system having object detection capabilities are described in detail herein as examples. However, these arrangements are merely illustrative. If desired, the MDAC stages, ADC circuitry, ADC testing circuitry, and the associated systems and methods described herein may be implemented in any of the above-mentioned systems or any other suitable systems.

Figure 1:
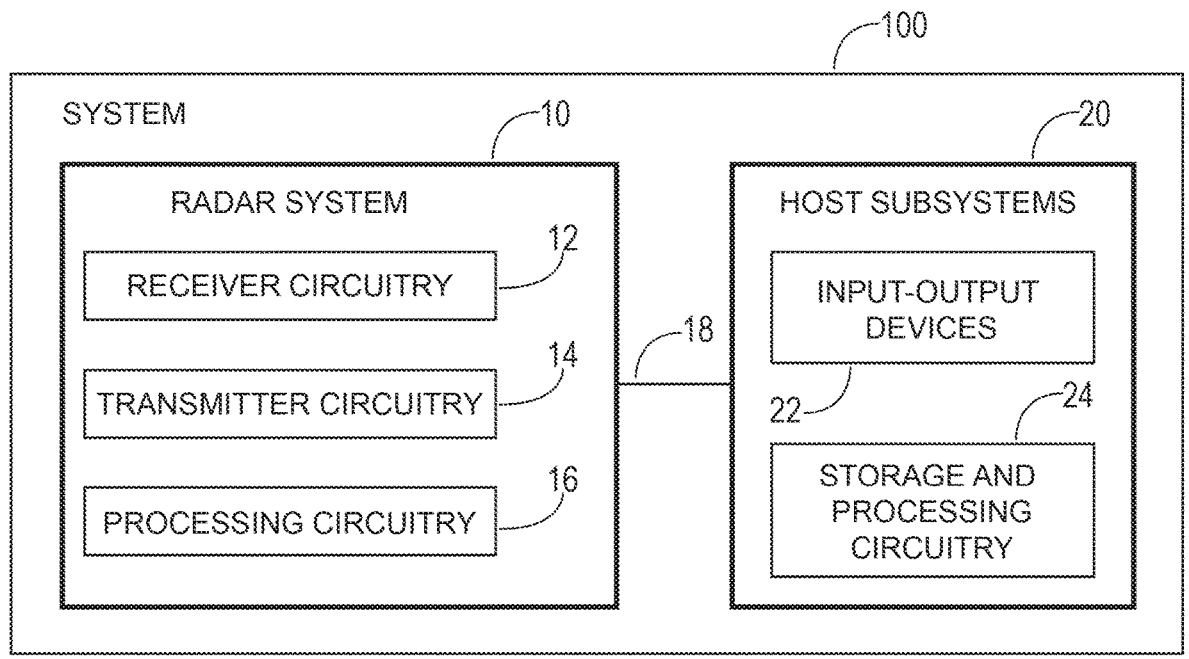
FIG. 1 is a diagram of an illustrative electronic system having a RADAR system in accordance with some embodiments.

FIG. 1 is a diagram of an illustrative electronic system including a radio detection and ranging (RADAR) system that uses radio waves to perform object detection (e.g., by determining the range, angle, velocity, or other characteristics of objects in an environment). System 100 of FIG. 1 may be an electronic device such as a camera, a cellular telephone, a video camera, or other electronic device that captures digital image data, may be a vehicle safety system (e.g., an active braking system or other vehicle safety system) or other automotive system, may be an object detection system (e.g., a RADAR-based system), may be a surveillance system, or may be any other suitable system.

As shown in FIG. 1, system 100 may include an imaging system such as RADAR system 10 and host subsystems such as host subsystem 20. RADAR system 10 may include receiver circuitry 12, transmitter circuitry 14, and processing circuitry 16. Processing circuitry 16 may include baseband circuitry, signal generation circuitry, signal processing circuitry, or other types of circuitry (e.g., other types of circuitry for supporting the transmission and reception of antenna signals using receiver circuitry 12 and transmitter circuitry 14, other types of circuitry for supporting object detection operations, etc.).

Processing circuitry 16 may provide signals over transmitting signal paths to transmitter circuitry 14 for transmitting the signals (e.g., radio-frequency antenna signals) over antennas. Processing circuitry 16 may also receive signals over receiving signal paths from receiver circuitry 16 for receiving the signals using antennas. Based on the transmitted signals and the received signals, the processing circuitry 16 may perform object detection operations (e.g., RADAR-based operations) and generate the corresponding data for further processing and/or storage.

RADAR system 10 (e.g., processing circuitry 16) may convey generated data to host subsystem 20 over path 18. Host subsystem 20 may include processing software instructions for further identifying or detecting objects in the environment, for detecting motion of objects relative to other objects, for determining distances to objects, for filtering or otherwise processing the generated data provided by RADAR system 10.

If desired, system 100 may provide a user with numerous high-level functions. In a computer or advanced automotive system, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
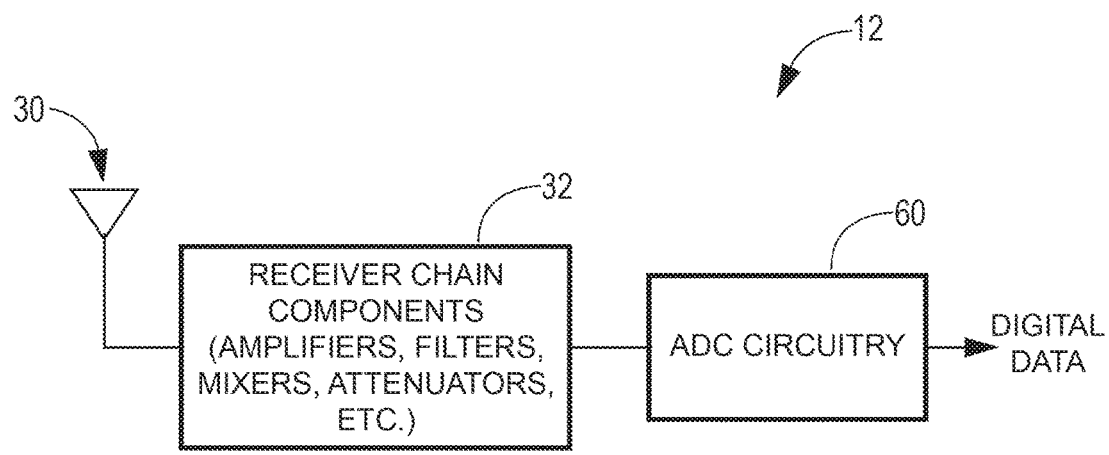
FIG. 2 is a diagram of illustrative receiver chain circuitry for processing received antenna signals in accordance with some embodiments.

FIG. 2 is a diagram of circuitry on a receiver chain path for receiver circuitry such as receiver circuitry 12 in FIG. 1. In particular, receiver circuitry 12 may include antenna circuitry 30 (e.g., one or more antennas having antenna resonating elements, antenna tuning elements, etc.). Antenna circuitry 30 may be coupled to processing circuitry (e.g., a baseband processor of processing circuitry in FIG. 1) via one or more receiver chain paths.

Receiver chain components such as receiver chain components 32 may be interposed along the receiver chain path. In particular, receiver chain components may include amplifier circuitry, filter circuitry, mixer circuitry, attenuator circuitry, and other types of signal processing circuitry.

As a particular example, the radio-frequency signals received by antenna circuitry 30 may pass through a low-noise amplifier, and subsequently, a mixer. The mixer may down-convert the frequency of the received signal to generate a corresponding signal having an intermediate frequency. The signal having the intermediate frequency may thereafter pass through a series of filters (e.g., high-pass filters, low-pass filters, and/or band-pass filters) and amplifiers to remove any undesired noise and improve signal quality. This is merely illustrative. If desired, other suitable operations may be performed on the signal received by antenna circuitry 30. The final processed antenna signal may be output from receiver chain components 32 (e.g., a last component in the series of receiver chain components) to downstream circuitry.

To convert analog antenna-based signals such as antenna signals after passing through receiver chain components 32, receiver circuitry 12 (e.g., the receiver chain path in receiver circuitry 12) may include ADC circuitry such as ADC circuitry 60. ADC circuitry 60 may generate digital data based on the analog signals and may provide the digital data to processing circuitry 16 (FIG. 1) for further processing and/or analysis. If desired, ADC circuitry 60 may also be included in any other suitable portion of system 100 in FIG. 1 (e.g., may be included in other portions of RADAR system 10 and/or in host subsystems 20 in FIG. 1).

Figure 3:
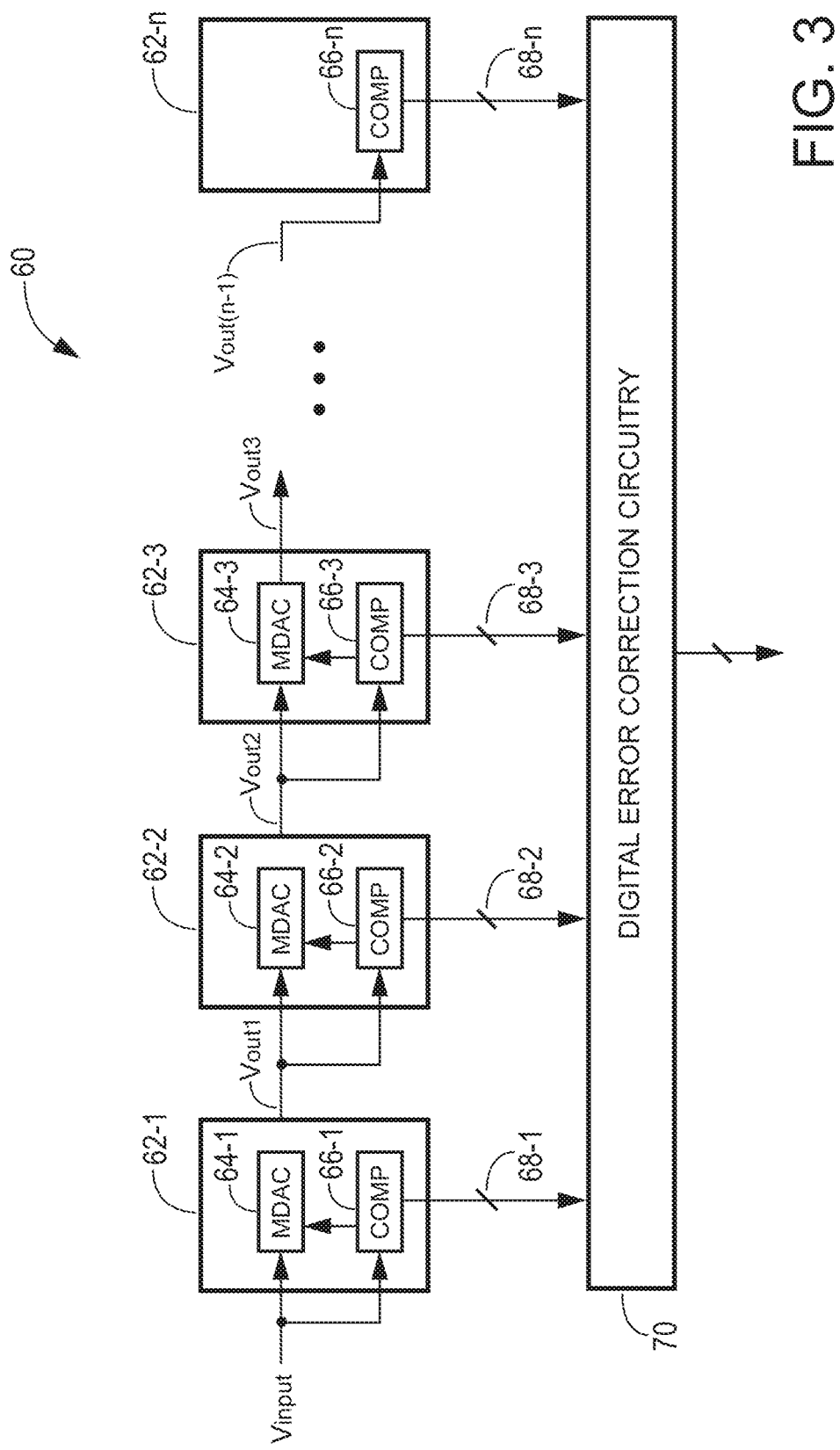
FIG. 3 is a diagram of illustrative pipeline ADC circuitry in accordance with some embodiments.

FIG. 3 is a block diagram of illustrative ADC circuitry such as ADC circuitry 60 in FIG. 2. As an example, ADC circuitry 60 may be implemented as pipeline ADC circuitry having multiple stages. As shown in FIG. 3, ADC circuitry 60 may include n stages 62-1, 62-2, 62-3, . . . , 62-n. Each stage 62, with the exception of the last stage 62-n, may include corresponding MDAC circuitry 64 and comparator circuitry 66, while the last stage 62-n may include comparator circuitry 66-n but may omit the corresponding MDAC circuitry 64 (or may have unused MDAC circuitry). Each corresponding MDAC circuitry 64 in stages 62 may pass signals to a subsequent stage, thereby creating a pipeline path. Stages 62 may therefore sometimes be referred to herein as MDAC stages 62.

ADC circuitry 60 may include any suitable number of MDAC stages 62. Stages 62 may perform conversion operations to resolve corresponding sets of bits (e.g., one bit, one-and-a-half bits, two bits, two-and-a-half bits, etc.), the combination of which are used to generate the final digital data.

In particular, MDAC circuitry 64-1 and comparator circuitry 66-1 in first stage 62-1 may receive an analog input signal vinput. Comparator 66-1 may resolve a first set of bits such as a set of most significant bits (e.g., a single bit, one-and-a-half bits, two bits, two-and-a-half bits, three bits, more than three bits, etc.). The first set of bits may include a portion of fully resolved bits and a portion of partially resolved bits (e.g., an overlap bit). Comparator 66-1 may provide the resolved first set of bits over path 68-1. Comparator 66-1 may also provide the resolved first set of bits to MDAC circuitry 64-1. MDAC circuitry 64-1 may convert the resolved first set of bits to an analog-equivalent signal and subtract the analog-equivalent signal associated with the first set of bits from the input analog signal vinput. The difference signal (e.g., between the analog-equivalent signal and the input analog signal vinput) may be amplified and provided to the next stage (e.g., stage 62-2) as signal vout1.

Based on input signal vout1, comparator circuitry 66-2 in stage 62-2 may generate a second set of bits that are output over path 68-2. MDAC circuitry 64-2 may convert the second set of bits to an analog-equivalent signal and subtract the analog-equivalent signal associated with the second set of bits form the input signal of stage 62-2 (e.g., signal vout1). The difference signal (e.g., between the analog-equivalent signal and the input signal of stage 62-2 vout1) may be amplified and provided to the next stage (e.g., stage 63-3) as signal vout2. In a similar manner, stage 62-3, 62-4, . . . , 62-n may output corresponding sets of bits over corresponding paths 68 and send corresponding output analog signal to the immediately subsequent stage if not the last stage (e.g., stage 62-n may output a corresponding set of bits such as the least significant bits over path 68-n but may omit passing an analog signal for a subsequent stage).

ADC circuitry 60 may include digital error correction circuitry 70. Digital error correction circuitry 70 may receive corresponding sets of bits resolved by stages 62 over paths 68. Digital error correction circuitry 70 generate the converted final digital data based on the received sets of bits (e.g., by resolving overlapping bits between different stages or by performing any other suitable processing operations).

In some applications such as automotive or object detection applications, a system having ADC circuitry may be required to meet one or more standards (e.g., the ISO 26262 standard, one or more ASIL requirements, etc.) and perform one or more tests for the ADC circuitry (e.g., for determining a performance of the ADC circuitry). While some methodologies call for checks (e.g., FFT tests) for ADC performance parameters such as DNL and/or INL, these methodologies require large amounts of area and increased costs in the circuit design, not to mention additional time overhead for sampling a large number of inputs.

The systems and methods described herein in accordance with the present embodiments is configured to check ADC performance with few input combinations are selectively coupled (e.g., to the ADC circuitry). These few input combinations may be selected such that the ADC testing circuitry can detect performance degradation in MDAC stage performance of the ADC circuitry (as an example). In particular, the systems and methods described herein can detect errors caused by small signal parameter changes that cause gain errors, cap value changes, etc.

Figure 4:
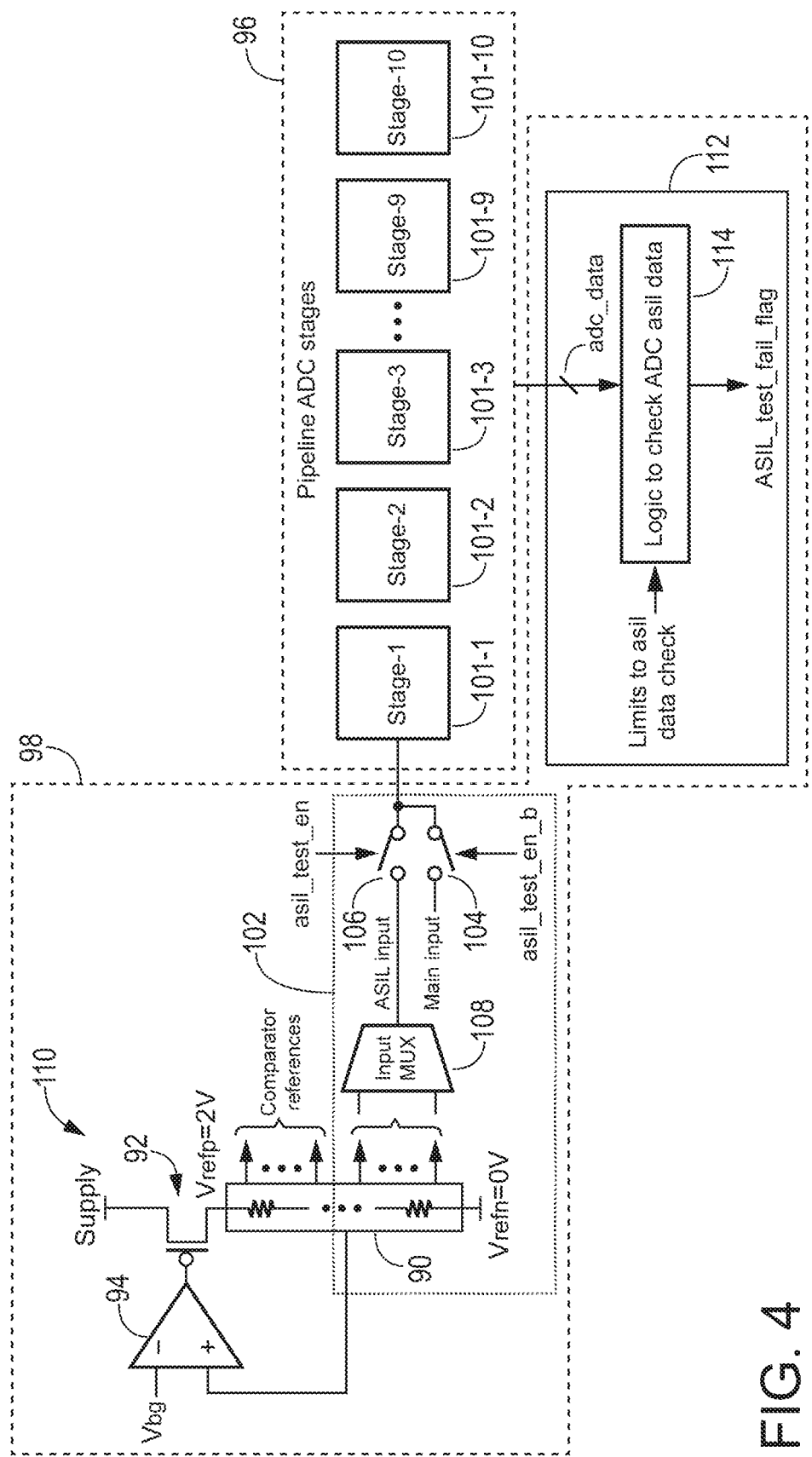
FIG. 4 is a diagram of illustrative ADC testing circuitry coupled to illustrative pipeline ADC circuitry in accordance with some embodiments.

FIG. 4 is a diagram of illustrative testing circuitry coupled to illustrative ADC circuitry (e.g., a pipeline ADC). ADC circuitry such as pipeline ADC 96 may include any suitable number of MDAC stages, sometimes referred to herein as pipeline ADC stages, such as stages 62 in FIG. 3. In the illustrative example of FIG. 4, ADC circuitry 96 may include ten stages 101-1 to 101-10 (with corresponding bit resolutions). The number and bit resolution of stages in ADC circuitry 96 are merely illustrative. In general, a pipeline ADC of any suitable resolution may be implemented (e.g., have any corresponding number of stages each having any suitable bit resolution). Configurations in which pipeline ADC 96 includes 10 or 9 stages and has a 13-bit resolution are described herein merely as illustrative examples.

Testing circuitry such as ADC testing circuitry 98 may include switching circuitry 102, logic circuitry 112, and reference voltage generation circuitry 110. The first stage 101-1 (e.g., the most upstream stage) in ADC circuitry 96 may be coupled to switching circuitry 102 in testing circuitry 98. Switching circuitry 102 may include a pair of switches 104 and 106 coupled to the input of stage 101-1 (e.g., input receiving signal vinput in FIG. 3). A first switch 104 may be configured to connect a main input or system data input to ADC circuitry 96. A second switch 106 may be configured to connect a test input (e.g., a test input for ASIL purposes) to ADC circuitry 96.

In other words, when switch 104 is enabled (e.g., in a closed state), stage 101-1 may receive test signals as input signals, and when switch 106 is enabled (e.g., in a closed state), stage 101-1 may receive main data signals as input signals. If desired, when one switch is enabled, the other switch is disabled (e.g., in an open state). Whereas the test input may be used to test, diagnose, analyze, or otherwise determine ADC performance for ADC circuitry 96, the main input may be used to convert actual data signals for the system in which ADC circuitry 96 is implemented (sometimes referred to as system data signals, e.g., received antenna signals as shown in FIG. 2, received information from a RADAR system, etc.). As an example, the main input may be coupled to the receiver chain path shown in FIG. 2.

As shown in FIG. 4, the test or ASIL input may be coupled to (e.g., provided using) a multiplexing circuit 108 (e.g., an input multiplexer) in switching circuitry 102. Multiplexing circuit 108 may pass a selected voltage in a plurality of output voltages at a time from reference voltage generation circuitry such as reference voltage ladder 110 to the test input.

In the example of FIG. 4, reference voltage generation circuitry 110 may include amplifier circuitry 94, transistor 92, and resistors 90. In particular, transistor 92 may be coupled in series with resistors 90 coupled in series. Transistor 92 may supply a first reference voltage Vrefp such as 2 V to a first terminal of the series of resistors 90, and a second terminal of the series of resistors 90 may be coupled to voltage Vrefn such as 0 V. Amplifier circuitry 94 may receive a reference voltage Vbg at a first input terminal and may have a second terminal coupled to one or more nodes within the series of resistors 90. The output terminal of amplifier circuitry 98 may be coupled to PMOS transistor 92. This configuration for generating reference voltages is merely illustrative. If desired any other types of reference voltage generation circuitry may be implemented.

Supply voltage ladder 110 (or generally reference voltage generation circuitry 110) may be configured to supply the test input voltages as well as comparator reference voltages (e.g., for ADC circuitry 96). The test input and the corresponding switching circuitry 102 (e.g., multiplexer 108) may thereby utilize existing circuitry in ADC circuitry 96 and/or system 100 (e.g., existing reference voltage generation circuitry for comparators) to form the testing circuitry 98. For testing ADC circuitry 96, multiplexing circuitry 108 may provide a series of voltages (e.g., a predetermined set of voltages) from corresponding output nodes of reference voltage ladder 110 through switch 106 to ADC circuitry 96 as test inputs.

In response to the test inputs, ADC circuitry 96 may generate corresponding (test) outputs at each of its stages 101-1 to 101-10 (as signal adc_data as shown in FIG. 4). The output of each stage may be supplied to logic circuitry 112. Logic circuitry 112 may include output test data checking circuitry 114 (e.g., formed from logic circuitry configured to check output ADC data). In addition to receiving output test data from ADC 100, test data checking circuitry 114 may also receive expected (upper and/or lower) threshold values for one or more of the output data (e.g., limits for ASIL data check). These expected threshold values may be stored at and/or defined by registers (e.g., registers coupled to data checking circuitry 114).

In particular, testing circuitry 98 (e.g., for ASIL requirements) may selectively provide test input voltages via switch 106 to ADC circuitry 100. ADC testing circuitry may further analyze the ADC output (generated based on the input test voltages) to determine whether ADC performance is satisfactory and whether the ADC output is reliable. Given that a single input test voltage may be insufficient to test ADC circuitry 96 (e.g., to test the performance of all stages 101), ADC testing circuitry 98 may be configured to provide a selected set of voltages over switch 106 to ADC circuitry 96 to determine the performance of each of the stages of ADC circuitry 96 (e.g., to determine the performance of the entirety of ADC circuitry 96). In particular control circuitry (e.g., processing circuitry 16 in FIG. 1) may control ADC testing circuitry 98 to perform testing functions (e.g., control the state of switches 104 and 106, control the state of multiplexer 108 such as which reference voltage to pass to the test input, control the threshold values or limits of logic circuitry 114, etc.).

Advantageously, given that the input voltages provided for the set of test voltages may be tapped from existing reference voltage generation circuitry 110 (e.g., for generating comparator reference voltages in comparators 66 in FIG. 3), no additional reference voltage generation circuitry is required (e.g., unlike in DNL or INL tests in which a ramp generation circuit would be required, or in FFT tests in which sine-wave generation circuit is required).

Additionally, since test and main inputs are separately and selectively coupled to ADC circuitry 96, ADC testing circuitry 98 may be selectively active when ADC circuitry is not in use for (imaging) operations (e.g., for signal receiver operations, for RADAR operations, for object detection operations, for other active functions of a corresponding system in which ADC circuitry 96 is implemented). In other words, during the blanking or idling time period for these operations (e.g., between time periods of active operation of the corresponding system, when these operations are not actively being performed, etc.) ADC circuitry 96 may receive test inputs.

ADC testing circuitry 98 may check the ADC output (e.g., a plurality of ADC output values) for each test input voltage against a corresponding expected output range defined as limits for each input separately on register circuitry (e.g., implemented on a chip register). If the output for each test input voltage meets their corresponding limits (e.g., below an upper threshold value, above a lower threshold value, etc.), ADC testing circuitry 98 may determine that ADC performance is satisfactory. Logic circuitry 114 may assert an output signal (e.g., "ASIL_test_fail_flag"), if logic circuitry 114 determines that ADC performance is unsatisfactory.

FIGS. 5-11 describe illustrative configurations in which a nine-stage 13-bit pipeline ADC operates in combination with ADC testing circuitry. Description associated with a nine-stage and/or 13-bit pipeline ADC is provided merely as a particular example for illustrating ADC operations with the ADC testing circuitry. If desired, ADC testing circuitry may be configured to test and may be implemented with pipeline ADC with any suitable resolution and corresponding stages in an analogous manner. As examples, ADC testing circuitry may be implemented with and test a 12-bit pipeline ADC, a 16-bit pipeline ADC, etc.

Figure 5:
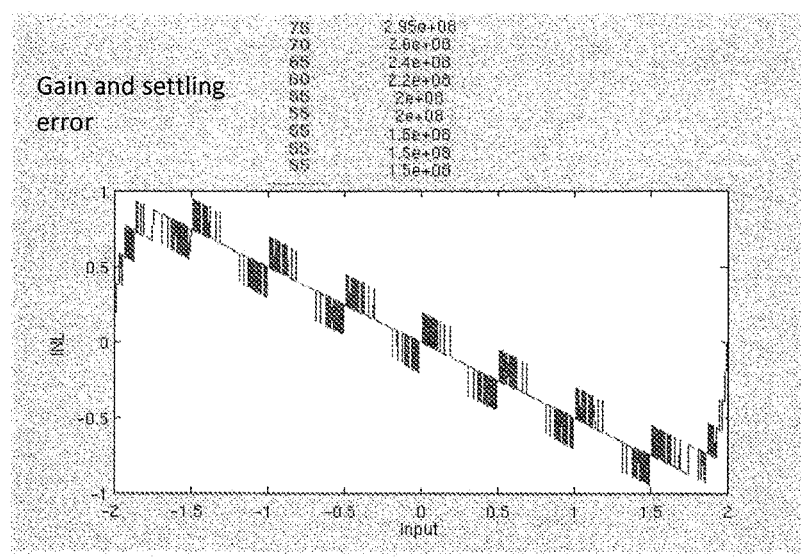
FIG. 5 is a diagram of parameters for an illustrative 13-bit pipeline ADC in accordance with some embodiments.

FIG. 5 is a diagram of the performance and parameters of nine stages in a 13-bit pipeline ADC (e.g., may be applied analogously to one or more stages in the 10-stage ADC circuitry 96 in FIG. 4). These ADC configurations described in FIGS. 4 and 5 are merely illustrative. If desired, any suitable type of ADC may be used. Arrangements in which the 10-stage 13-bit pipeline ADC is coupled to the ADC testing circuitry described in FIG. 4 are described herein as examples. One or more stages in ADC circuitry 96 may have similar performance requirements as depicted for one or more stages in FIG. 5. A corresponding illustrative integral nonlinearity (INL) curve is shown in FIG. for the target gain and bandwidth requirements.

In particular, each stage of the ADC circuitry (e.g., ADC circuitry 96) may be implemented with a corresponding bit resolution (e.g., "Bits Per Stage"), a corresponding loop gain requirement (e.g., "Required Loop Gain"), a corresponding bandwidth requirement (e.g., "BW Required"), etc. The ADC circuitry may also exhibit other corresponding performance parameters and/or have corresponding requirements for these performance parameters such as SNDR (signal to noise and distortion) requirements, SFDR (spurious-free dynamic range) requirements, ENOB (effective number of bits) requirements, etc., which may dependent on the cumulative performance of each stage. ADC testing circuitry such as testing circuitry 98 may be configured to test whether or not each of the stages in the ADC circuitry meets these requirements (e.g., stage gain requirements, stage bandwidth requirements, etc.), thereby meeting the corresponding ADC requirements.

Figure 6:
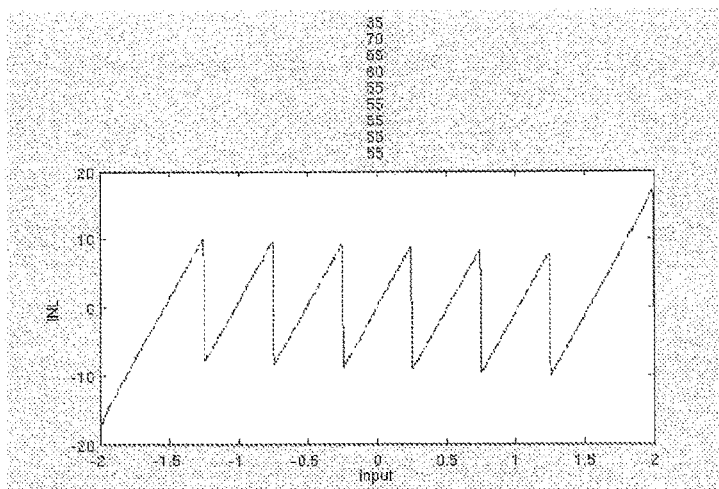
FIGS. 6-11 are diagrams of parameters indicative of different errors in different stages of an illustrative 13-bit pipeline ADC such as the pipeline ADC described in connection with FIG. 5 in accordance with some embodiments.

FIG. 6 is a diagram of the performance and parameters of a (9-stage) 13-bit pipeline ADC (e.g., the ADC circuitry described in connection with FIG. 5) with a gain error in stage 1 (e.g., the most upstream stage such as stage 101-1 in FIG. 4). In particular, a plot having an INL curve is shown. In the plot, the INL curve shows that maximum deviation is observed when the input(s) (e.g., input voltage value) to stage 1 is close to the comparator threshold voltage(s) (e.g., 1.25 V, 0.75 V, 0.25 V, −0.25 V, −0.75 V, −1.25 V as shown in FIG. 6). Therefore, to check for stage 1 gain error performance, ADC testing circuitry such as testing circuitry 98 in FIG. 4 may supply an input voltage close to any of the comparator threshold voltages and detect its output deviations (e.g., stage output deviations) from the expected code (e.g., the expected value).

As an example, input multiplexer 108 in FIG. 4 may select one of these comparator threshold voltage values from reference voltage generation circuitry 110 (e.g., a corresponding voltage ladder output) in FIG. 4 and supply the corresponding voltage to the ADC circuitry as the test input (e.g., through switch 106 in FIG. 4). Logic circuitry 112 in FIG. 4 may receive ADC output values based on these test inputs. In particular, ASIL data check logic circuitry 114 may store and/or receive an expected ASIL value such as 3583 (e.g., "asil_code0" in FIG. 6) but may receive the corresponding ASIL check value received from the ADC circuitry such as value 3574, which may be well outside of the tolerance (e.g., logic circuitry 114 may determine any value between 3581 and 3585, inclusive, or any other upper and lower threshold values to be satisfactory). Based on the large difference between the received ASIL check value from ADC circuitry 110 and the expected ASIL value, testing circuitry may determine that ADC circuitry performance is not satisfactory (e.g., stage 1 does not meet gain requirements). If desired, control circuitry such as processing circuitry 16 in FIG. 1 may be configured to provide control and/or signals to elements of testing circuitry 98 to perform one or more of these functions.

Figure 7:
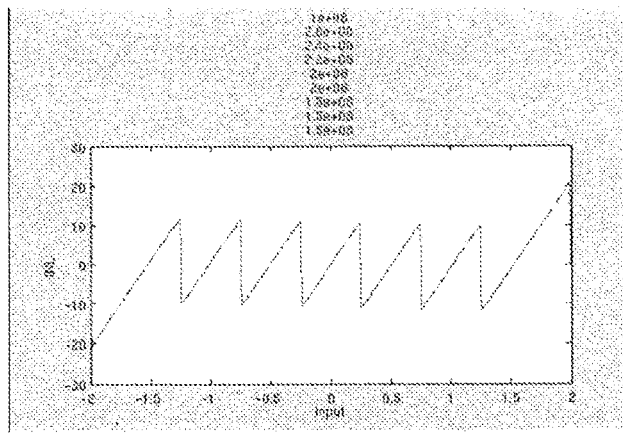

FIG. 7 is a diagram of the performance and parameters of a (9-stage) 13-bit pipeline ADC (e.g., the ADC circuitry described in connection with FIG. 5) with a settling error (e.g., due to bandwidth change) in stage 1. In particular, a plot having an INL curve is shown. In the plot, the INL curve shows that maximum deviation is observed when the input(s) is close to the comparator threshold voltage(s). Therefore, to check for stage 1 settling error performance, ADC testing circuitry such as testing circuitry 98 in FIG. 4 may supply an input voltage close to any of the comparator threshold voltages and detect its deviations (e.g., stage output deviations) from the expected code (e.g., the expected value). If desired, combined with the previous gain error check scheme (as described in connection with FIG. 6), the ADC testing circuitry may supply the same test input voltage (e.g., near one of these comparator threshold voltages or input voltages showing maximum deviation) to check both stage 1 gain performance and stage 1 settling performance.

For example, as similarly described in connection with FIG. 6, reference voltage generation circuitry 110 and switching circuitry 102 may provide one or more test input voltages to ADC circuitry 96 in FIG. 4. ASIL data check logic circuitry 114 in FIG. 4 may identify an expected ASIL value (e.g., 3583) and corresponding threshold ASIL values (e.g., lower threshold value 3581 and upper threshold value 3585), and determine that the received output test value from the ADC circuitry is within or outside the threshold values. In the example of FIG. 7, the received value of 3572 may be indicative of an error (e.g., a settling error associated with a lower than required bandwidth), as an example.

Figure 8:
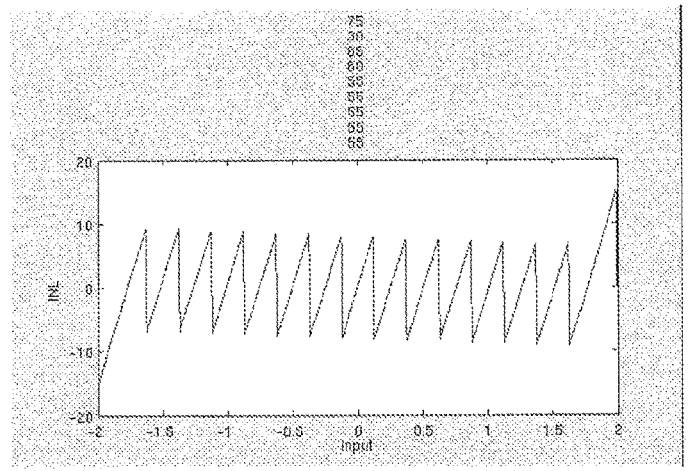

FIG. 8 is a diagram of the performance and parameters of a (9-stage) 13-bit pipeline ADC (e.g., the ADC circuitry described in connection with FIG. 5) with a gain error in stage 2 (e.g., the second-most upstream stage such as stage 101-2 in FIG. 4). In particular, a plot having an INL curve is shown. For this stage, comparator threshold voltages Vcomp may be ±0.5 (V). The total gain before this stage PG (e.g., total gain from one or more previous stages) may be 4 (e.g., based on the gain of stage 1). Consequently, the maximum deviations may be at ±(Vcomp/PG), ±(3*Vcomp/PG), ±(5*Vcomp/PG), ±(7*Vcomp/PG), ±(9*Vcomp/PG), ±(11*Vcomp/PG) and ±(13*Vcomp/PG).

In particular, the INL curve in FIG. 8 shows that maximum deviation is observed when the input(s) are near ±0.125, ±0.375, ±0.625, ±0.875, ±1.125, ±1.375 and ±1.625 (V). Therefore, to check for stage 2 gain error performance, ADC testing circuitry such as ADC circuitry 98 in FIG. 4 may supply an input voltage close to any of these maximum deviation voltages and detect its deviations (e.g., stage output deviations) from the expected code (e.g., the expected value).

Figure 9:
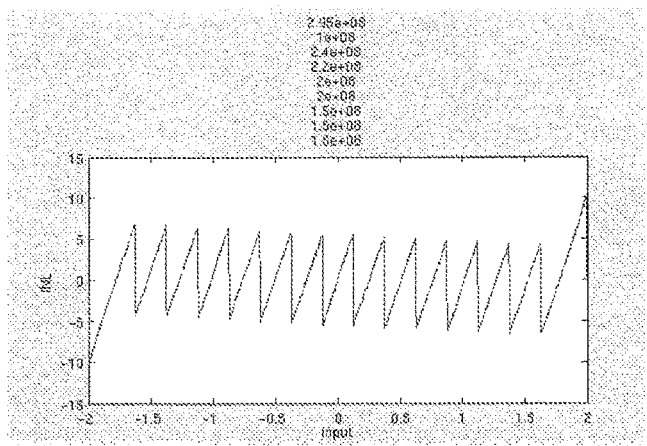

FIG. 9 is a diagram of the performance and parameters of a (9-stage) 13-bit pipeline ADC (e.g., the ADC circuitry described in connection with FIG. 5) with a settling error (e.g., due to bandwidth change) in stage 2. In particular, a plot having an INL curve is shown. For this stage, comparator threshold voltages Vcomp may be ±0.5 (V). The total gain before this stage PG (e.g., total gain from one or more previous stages) may be 4 (e.g., based on the gain of stage 1). Consequently, the maximum deviations may be at ±(Vcomp/PG), ±(3*Vcomp/PG), ±(5*Vcomp/PG), ±(7*Vcomp/PG), ±(9*Vcomp/PG), ±(11*Vcomp/PG) and ±(13*Vcomp/PG).

In particular, the INL curve in FIG. 9 shows that maximum deviation is observed when the input(s) are near ±0.125, ±0.375, ±0.625, ±0.875, ±1.125, ±1.375 and ±1.625 (V). Therefore, to check for stage 2 settling error performance, ADC testing circuitry such as testing circuitry 98 in FIG. 4 may supply an input voltage close to any of these maximum deviation voltages and detect its deviations (e.g., stage output deviations) from the expected code (e.g., the expected value). If desired, combined with the previous gain error check scheme (as described in connection with FIG. 8), the ADC testing circuitry may supply one test input voltage (e.g., near one of these input voltages showing maximum deviation) to check stage 2 for both gain and settling performance. For example, an analogous process (e.g., with different test input voltages) using elements of testing circuitry in FIG. 4 as described in connection with FIGS. 6 and 7 may be implemented for stage 2 testing.

Figure 10:
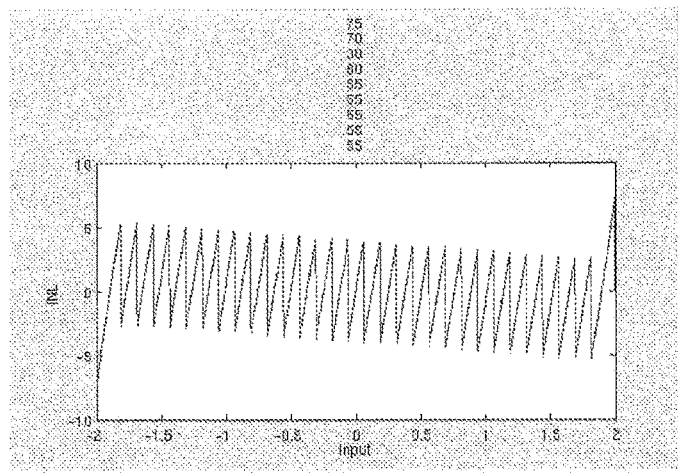

FIG. 10 is a diagram of the performance and parameters of a (9-stage) 13-bit pipeline ADC (e.g., the ADC described in connection with FIG. 5) with a gain error in stage 3 (e.g., the third-most upstream stage such as stage 101-3 in FIG. 4). In particular, a plot having an INL curve is shown. For this stage, comparator threshold voltages Vcomp may be ±0.5 (V). The total gain before this stage PG (e.g., total gain from one or more previous stages) may be 8 (e.g., based on the gains of stages 1 and 2). Consequently, the maximum deviations may be at ±(Vcomp/PG), ±(3*Vcomp/PG), ±(5*Vcomp/PG), ±(7*Vcomp/PG), ±(9*Vcomp/PG), etc.

In particular, the INL curve in FIG. 10 shows that maximum deviation is observed when the input(s) are near ±0.0625, ±0.1875, ±0.3125, ±0.4375, ±0.5625 (V). Therefore, to check for stage 3 gain error performance, ADC testing circuitry such as testing circuitry 98 in FIG. 4 may supply an input voltage close to any of these maximum deviation voltages and detect its deviations (e.g., stage output deviations) from the expected code (e.g., the expected value).

Figure 11:
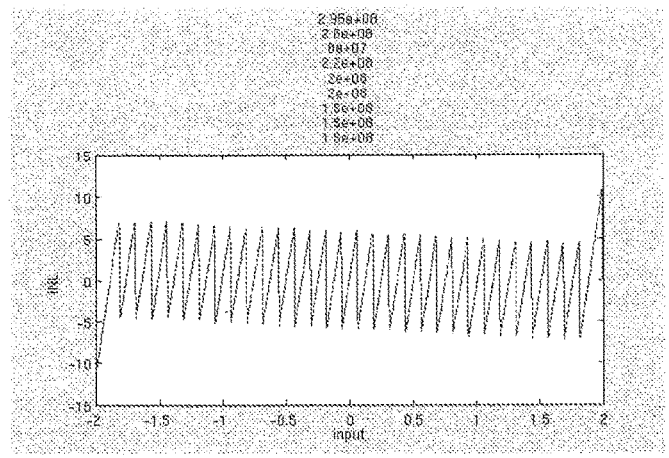

FIG. 11 is a diagram of the performance and parameters of a (9-stage) 13-bit pipeline ADC (e.g., the ADC described in connection with FIG. 5) with a settling error (e.g., due to bandwidth change) in stage 3. In particular, a plot having an INL curve is shown. For this stage, comparator threshold voltages Vcomp may be ±0.5 (V). The total gain before this stage PG (e.g., total gain from one or more previous stages) may be 8 (e.g., based on the gains of stages 1 and 2). Consequently, the maximum deviations may be at ±(Vcomp/PG), ±(3*Vcomp/PG), ±(5*Vcomp/PG), ±(7*Vcomp/PG), ±(9*Vcomp/PG), etc.

In particular, the INL curve in FIG. 11 shows that maximum deviation is observed when the input(s) are near ±0.0625, ±0.1875, ±0.3125, ±0.4375, ±0.5625 (V). Therefore, to check for stage 3 settling error performance, ADC testing circuitry may supply an input voltage close to any of these maximum deviation voltages and detect its deviations (e.g., stage output deviations) from the expected code (e.g., the expected value). If desired, combined with the previous gain error check scheme (as described in connection with FIG. 10), the ADC testing circuitry may supply one test input voltage (e.g., near one of these input voltages showing maximum deviation) to check stage 3 for both gain and settling performance. For example, an analogous process (e.g., with different test input voltages) using elements of testing circuitry in FIG. 4 as described in connection with FIGS. 6 and 7 may be implemented for stage 3 testing.

Similarly, the analogous test input voltage determination scheme may be utilized (e.g., by ADC testing circuitry 98 in FIG. 4) for the testing rest of the stages in the ADC circuitry. In some configurations, one single input voltage for one stage (supplied by ADC testing circuitry) may be sufficient to check the performance of the entire ADC. In accordance with these testing schemes described herein, the input voltage for a stage (except the first stage) may be determined based on the total gain in previous stages (PG) the comparator thresholds (Vcomp) of the current stage. Based on these parameters, the maximum deviation voltages corresponding to the desirable input voltages may be supplied at ±(Vcomp/PG), ±(3*Vcomp/PG), ±(5*Vcomp/PG), ±(7*Vcomp/PG), ±(9*Vcomp/PG), ±(9*Vcomp/PG) and ±(11*Vcomp/PG), etc. The first stage may be an exception because of the absence of gain from a previous stage. As such, the input voltage for the first stage can be chosen to be the same as one of the comparator threshold voltages for the first stage.

In the example of a 9-stage pipeline ADC, ADC testing circuitry may supply a (maximum) total of nine different test input voltages to sufficiently test the performance of the 9-stage pipeline ADC (e.g., one for each stage). ADC testing circuitry may analyze corresponding outputs for the nine input voltages to determine if the output data value is within predetermined threshold values (e.g., within the limits). The logic circuitry required to implement such a logical function is sufficiently small (e.g., consumes less area when compared to other testing schemes, thereby providing cost savings).

Additionally, in many configurations, a total of less than nine different test input voltages may be used to sufficiently test the performance of all nine stages of a nine-stage pipeline ADC. As an example, stages with the same bit resolution (and/or other parameters) may be tested using the same test input voltage (e.g., when the same input voltages are configured to exhibit maximum deviation at multiple stages). As such, the total of different test input voltages sufficient to test the performance of a pipeline ADC may be reduced dependent on the ADC stage implementation (e.g., to the number of different bit resolution stages being implemented, etc.).

The illustrative examples in FIGS. 4-11 for implementing and operating ADC testing circuitry are merely illustrative. If desired, any number of suitable input test values may be used to test any suitable type of ADC circuitry (e.g., ADC circuitry with any number of stages each have any different types of bit resolutions). If desired, expected output values may have any suitable range (e.g., any amount of deviation from an expected value).

Various embodiments have been described illustrative systems and methods for efficiently performing testing for ADC circuitry.

As an example, a system may include analog-to-digital converter circuitry, switching circuitry coupled to an input terminal of the analog-to-digital converter circuitry and configured to provide one of a test input or a system data input to the input terminal, and logic circuitry coupled to the analog-to-digital converter circuitry and configured to receive a test output value from the analog-to-digital converter circuitry generated based on the test input and to identify an error in the analog-to-digital converter circuitry based on a comparison between the test output value and a threshold value. The system may also include reference voltage generation circuitry configured to generate a plurality of reference voltages, wherein the switching circuitry is configured to select one of the plurality of reference voltages as the test input to the input terminal of the analog-to-digital converter circuitry.

If desired, the reference voltage generation circuitry may be a reference voltage ladder having a plurality of output nodes, and the switching circuitry may include a multiplexing circuit having a plurality of input terminals, each coupled to a corresponding output node in the plurality of output nodes. The switching circuitry may also include a first switch coupling an output terminal of the multiplexing circuit to the input terminal of the analog-to-digital converter circuitry. If desired, a comparator in one of the stages in the analog-to-digital converter circuitry may be configured to receive a reference voltage, and the reference voltage generation circuitry may be configured to provide one of the plurality of reference voltages as the reference voltage to the comparator.

If desired, the system may include an imaging system configured to generate data signals, and the switching circuitry may be configured to provide the data signals as the system data input.

If desired, the system may include an object detection system such as a radio detection and ranging system configured to receive data signals, and the switching circuitry may be configured to provide the data signals as the system data input to the input terminal of the analog-to-digital converter circuitry. In an illustrative configuration, the object detection system may include receiver circuitry having a receiver chain path, and the switching circuitry may include a second switch coupling the receiver chain path to the input terminal of the analog-to-digital converter circuitry.

In some configurations, the analog-to-digital converter circuitry may include a plurality of stages coupled in series, and the input terminal of the analog-to-digital converter circuitry may be an input terminal at a first stage in the plurality of stages. Each of the plurality of stages has a corresponding output terminal coupled to the logic circuitry. If desired, the system may include register circuitry configured to store the threshold value and to provide the threshold value to the logic circuitry, and the corresponding output terminals of the plurality of stages may be configured to provide the test output value based on the test input received at the input terminal of the first stage.

In some configurations, the analog-to-digital converter circuitry may include a first comparator having a first comparator threshold voltage. The system may further include control circuitry configured to identify a first reference voltage as the test input based on the first comparator threshold voltage. The analog-to-digital converter circuitry may also include a second comparator having a second comparator threshold voltage (the same or different than the first comparator threshold voltage), and the control circuitry may be configured to identify a second reference voltage as the test input based on the second comparator threshold voltage. If desired, the comparator may be implemented at one stage in the analog-to-digital converter circuitry, and the logic circuitry may be configured to identify one of a gain error or a bandwidth error associated with the one stage based on a comparison between the test output value generated based on the reference voltage as the test input and the threshold value.

The foregoing is merely illustrative of the principles of this invention and various modifications can be made by those skilled in the art. The foregoing embodiments may be implemented individually or in any combination.

What is claimed is:

1. A system comprising:
analog-to-digital converter circuitry;
switching circuitry coupled to an input terminal of the analog-to-digital converter circuitry and configured to provide one of a test input or a system data input to the input terminal; and
logic circuitry coupled to the analog-to-digital converter circuitry and configured to receive a test output value from the analog-to-digital converter circuitry generated based on the test input and to identify an error in the analog-to-digital converter circuitry based on a comparison between the test output value and a threshold value.

2. The system defined in claim 1 further comprising:
reference voltage generation circuitry configured to generate a plurality of reference voltages, wherein the switching circuitry is configured to select one of the plurality of reference voltages as the test input to the input terminal of the analog-to-digital converter circuitry.

3. The system defined in claim 2, wherein the reference voltage generation circuitry comprises a reference voltage ladder having a plurality of output nodes, and the switching circuitry comprises a multiplexing circuit having a plurality of input terminals, each coupled to a corresponding output node in the plurality of output nodes.

4. The system defined in claim 3, wherein the switching circuitry comprises a switch coupling an output terminal of the multiplexing circuit to the input terminal of the analog-to-digital converter circuitry.

5. The system defined in claim 2, wherein the analog-to-digital converter circuitry comprises a comparator configured to receive a reference voltage, and the reference voltage generation circuitry is configured to provide one of the plurality of reference voltages as the reference voltage to the comparator.

6. The system defined in claim 1 further comprising:
an imaging system configured to generate data signals, wherein the switching circuitry is configured to provide the data signals as the system data input.

7. The system defined in claim 1, further comprising:
an object detection system configured to receive data signals, wherein the switching circuitry is configured to provide the data signals as the system data input to the input terminal of the analog-to-digital converter circuitry.

8. The system defined in claim 7, wherein the object detection system is a radio detection and ranging system.

9. The system defined in claim 7, wherein the object detection system comprises receiver circuitry having a receiver chain path, and the switching circuitry comprises a switch coupling the receiver chain path to the input terminal of the analog-to-digital converter circuitry.

10. The system defined in claim 1, wherein the analog-to-digital converter circuitry comprises a plurality of stages coupled in series, and the input terminal of the analog-to-digital converter circuitry is an input terminal at a first stage in the plurality of stages.

11. The system defined in claim 10, wherein each of the plurality of stages has a corresponding output terminal coupled to the logic circuitry.

12. The system defined in claim 11 further comprising:
register circuitry configured to store the threshold value and to provide the threshold value to the logic circuitry, wherein the corresponding output terminals of the plurality of stages are configured to provide the test output value based on the test input received at the input terminal of the first stage.

13. The system defined in claim 1, wherein the analog-to-digital converter circuitry comprises a comparator having a comparator threshold voltage, the system further comprising:
control circuitry configured to identify a reference voltage as the test input based on the comparator threshold voltage.

14. The system defined in claim 13, wherein the analog-to-digital converter circuitry comprises an additional comparator having an additional comparator threshold voltage, and the control circuitry is configured to identify an additional reference voltage as the test input based on the additional comparator threshold voltage.

15. The system defined in claim 13, wherein the comparator is implemented at one stage in the analog-to-digital converter circuitry, and the logic circuitry is configured to identify one of a gain error or a bandwidth error associated with the one stage based on a comparison between the test output value generated based on the reference voltage as the test input and the threshold value.

16. An object detection system comprising:
signal receiver circuitry:
processing circuitry coupled to the signal receiver circuitry via a signal path;
analog-to-digital converter circuitry coupled to the signal path via a first switch and configured to provide digital data to the processing circuitry; and
reference signal generation circuitry coupled to the analog-to-digital converter circuitry via a second switch and configured to provide a test reference voltage to the analog-to-digital converter circuitry via the second switch.

17. The object detection system defined in claim 16, wherein the analog-to-digital converter circuitry is configured to perform a conversion operation on the test reference voltage to generate a corresponding test output, the object detection system further comprising:
logic circuitry configured to determine an error in the analog-to-digital converter circuitry based on the test output and a limit for the test output.

18. The object detection system defined in claim 16, wherein the second switch is enabled and the first switch is disabled during a blanking time period of the signal receiver circuitry.

19. Analog-to-digital converter testing circuitry coupled to a pipeline analog-to-digital converter comprising:
reference voltage generation circuitry configured to provide a test input to the pipeline analog-to-digital converter;
switching circuitry coupled between the reference voltage generation circuitry and an input terminal of the pipeline analog-to-digital converter; and
logic circuitry coupled to an output terminal of the pipeline analog-to-digital converter and configured to receive a test output generated based on the test input and to compare the test output to a threshold value to determine a performance of the pipeline analog-to-digital converter.

20. The analog-to-digital converter testing circuitry defined in claim 19, wherein the pipeline analog-to-digital converter comprises a plurality of stages, the reference voltage generation circuitry is configured to provide a plurality of reference voltages to the pipeline analog-to-digital converter, and the logic circuitry is configured to receive a corresponding plurality of test output values generated based on the plurality of reference voltages and to determine a performance of each of the plurality of stages based on the plurality of test output values.

* * * * *